US012612340B2

(12) United States Patent
Favaloro et al.

(10) Patent No.:    US 12,612,340 B2
(45) Date of Patent:        Apr. 28, 2026

(54) SINGLE-CYCLE RAPID DENSIFICATION OF CARBON/CARBON COMPONENTS FOR AIR AND SPACE APPLICATIONS

(71) Applicant: Textron Systems Corporation, Hunt Valley, MD (US)

(72) Inventors: Michael Robert Favaloro, Amesbury, MA (US); Michael Vincent Salvucci, Clinton, MA (US); Matthew Weis Perrone, Boston, MA (US); Wesley Aaron Chapkin, Rockville, MD (US)

(73) Assignee: TEXTRON SYSTEMS CORPORATION, Hunt Valley, MD (US)

( * ) Notice: Subject to any disclaimer, the term of this patent is extended or adjusted under 35 U.S.C. 154(b) by 33 days.

(21) Appl. No.: 18/812,287

(22) Filed:    Aug. 22, 2024

(65)            Prior Publication Data

US 2025/0066261 A1      Feb. 27, 2025

Related U.S. Application Data

(60) Provisional application No. 63/534,617, filed on Aug. 25, 2023.

(51) Int. Cl.
C04B 35/83        (2006.01)
C04B 35/628        (2006.01)
            (Continued)

(52) U.S. Cl.
CPC ........ C04B 35/83 (2013.01); C04B 35/62873 (2013.01); C04B 35/62884 (2013.01);
            (Continued)

(58) Field of Classification Search
CPC ........ C04B 2235/614; C04B 2235/616; C23C 16/045
See application file for complete search history.

(56)            References Cited

U.S. PATENT DOCUMENTS 5,397,595 A  *  3/1995  Carroll ................... C04B 41/52
                                    427/430.1
5,547,717 A  *  8/1996  Scaringella ......... C04B 41/5001
                                    427/591
            (Continued)

FOREIGN PATENT DOCUMENTS

CN        1314233 A      9/2001
CN      106478120 A  *  3/2017  ............. C04B 35/52
EP      0592239 A2      4/1994

OTHER PUBLICATIONS

Delhaes et al., "Film Boiling Chemical Vapor Infiltration of C/C Composites: Influence of Mass and Thermal Transfers". Carbon Science vol. 4, No. 4 (2003) 163-167. (Year: 2003).*
            (Continued)

*Primary Examiner* — Atul P. Khare
(74) *Attorney, Agent, or Firm* — BainwoodHuang

(57)            ABSTRACT

A method of producing a densified carbon fiber reinforced carbon (carbon/carbon) component includes placing a carbon/carbon preform and preform heater(s) into a reactor vessel with an immersing quantity of a precursor liquid (e.g., hydrocarbon). The reactor vessel includes a condenser for condensing precursor gases (e.g., carbonaceous gases) produced during densification and thereby maintain a thermodynamic equilibrium. Electrical current is supplied to the preform heater over a multi-hour period of densification in which the precursor liquid is continually boiled and the precursor gases continually produced. The current is sufficient to maintain the preform at a densification temperature above a precursor cracking temperature, thereby causing the precursor gases to be diffused into the preform and dissociated gas species to be deposited. Densification begins within the preform and advances outwardly along a densification front until completion.

12 Claims, 3 Drawing Sheets

(51) Int. Cl.

| | |
|---|---|
| *C04B 35/64* | (2006.01) |
| *C23C 16/04* | (2006.01) |
| *C04B 35/52* | (2006.01) |

(52) U.S. Cl.
CPC ............ *C04B 35/64* (2013.01); *C23C 16/045* (2013.01); *C04B 2235/422* (2013.01); *C04B 2235/48* (2013.01); *C04B 2235/483* (2013.01); *C04B 2235/5248* (2013.01); *C04B 2235/5256* (2013.01); *C04B 2235/614* (2013.01); *C04B 2235/616* (2013.01)

(56) References Cited

U.S. PATENT DOCUMENTS

| | | | |
|---|---|---|---|
| 7,182,980 | B2 | 2/2007 | Goujard et al. |
| 7,727,591 | B2 | 6/2010 | Sion et al. |
| 7,897,072 | B2 | 3/2011 | La Forest et al. |
| 8,057,855 | B1 | 11/2011 | Rudolph et al. |
| 8,084,079 | B2 | 12/2011 | Thebault et al. |
| 8,133,532 | B2 | 3/2012 | Chang et al. |
| 8,163,088 | B2 | 4/2012 | Lamouroux et al. |
| 8,163,339 | B2 | 4/2012 | Fillion |
| 8,491,963 | B2 | 7/2013 | Lamouroux et al. |
| 8,529,995 | B2 | 9/2013 | Eberling-Fux et al. |
| 8,568,838 | B2 | 10/2013 | Chang et al. |
| 9,127,732 | B2 | 9/2015 | La Forest et al. |
| 9,309,159 | B2 | 4/2016 | Charleux et al. |
| 9,550,701 | B2 | 1/2017 | La Forest et al. |
| 9,845,534 | B2 * | 12/2017 | Delperier ................ C04B 35/56 |
| 10,035,305 | B2 | 7/2018 | La Forest et al. |
| 10,131,113 | B2 | 11/2018 | Troester et al. |
| 10,233,540 | B2 | 3/2019 | Bertrand et al. |
| 10,392,696 | B2 | 8/2019 | Bernard et al. |
| 10,836,684 | B2 | 11/2020 | Brender et al. |
| 10,906,205 | B2 | 2/2021 | Thibaud et al. |
| 11,472,744 | B2 | 10/2022 | Allemand et al. |
| 11,530,166 | B2 | 12/2022 | Delehouze et al. |
| 2009/0261090 | A1 | 10/2009 | Delperier et al. |
| 2010/0291373 | A1 | 11/2010 | Baud et al. |
| 2012/0261471 | A1 | 10/2012 | Wen et al. |
| 2015/0075428 | A1 | 3/2015 | Bertrand et al. |
| 2015/0218693 | A1 | 8/2015 | Bertrand et al. |
| 2019/0119171 | A1 | 4/2019 | Brender et al. |
| 2020/0061868 | A1 | 2/2020 | Thibaud et al. |
| 2020/0317585 | A1 | 10/2020 | Ding et al. |
| 2020/0325950 | A1 | 10/2020 | Bouillon et al. |
| 2021/0246549 | A1 | 8/2021 | Lamouroux et al. |
| 2022/0033313 | A1 | 2/2022 | Allemand et al. |
| 2022/0041513 | A1 | 2/2022 | Potin |

OTHER PUBLICATIONS

Dèlhaes et al., "Chemical vapor infiltration of C/C composites: Fast densification processes and matrix characterizations". Carbon 43 (2005) 681-691. (Year: 2005).*

Rovillain et al., "Film boiling chemical vapor infiltration An experimental study on carbon/carbon composite materials". Carbon 39 (2001) 1355-1365. (Year: 2001).*

Vignoles et al., "The film-boiling densification process for C/C composite fabrication: From local scale to overall optimization". Chemical Engineering Science 61 (2006) 5636-5653. (Year: 2006).*

Wang et al., "Improvement of film boiling chemical vapor infiltration process for fabrication of large size C/C composite". Materials Letters 60 (2006) 1269-1272. (Year: 2006).*

Paul et al., "Behavior of carbon matrix in carbon fiber reinforced composites (CFRC) synthesized through the film boiling chemical vapor infiltration (FB-CVI) process". Ceramics International 47 (2021) 14695-14706. (Year: 2021).*

Muhammed, Faheem; et al.; "Influence of Material and Process Parameters on Microstructure Evolution During the Fabrication of Carbon-Carbon Composites: a Review," Journal of Material Science, Kluwer Academic Publishers, Dordrecht, vol. 56, No. 32, Aug. 12, 2021, pp. 17877-179914.

International Search Report and Written Opinion of the International Searching Authority, dated Jun. 13, 2025, for PCT Application No. PCT/US2024/043383, filed Aug. 22, 2024, 17 pages.

* cited by examiner

SINGLE-CYCLE RAPID DENSIFICATION OF CARBON/CARBON COMPONENTS FOR AIR AND SPACE APPLICATIONS

BACKGROUND

The invention is generally in the field of strategic materials, and relates specifically to rapid densification of carbon/carbon components such as heatshields and similar components subjected to very high temperature ablative operating conditions.

SUMMARY

Carbon fiber reinforced carbon, also referred to as "carbon/carbon", is a known composite material. Due to a unique combination of high-temperature properties, carbon/carbon (C/C) composites have been used as structural materials in hypersonics and for reentry vehicles that experience very high-temperature operating conditions. It can be a challenge to produce high-quality C/C in sufficient quantities. This is due in part to bottlenecks for qualified preforms, as well as the expense and time requirements of existing densification processes which lead to undesirably long lead times for C/C materials. The result is a high-demand, low-production-rate material that can cost tens of thousands of dollars per pound for a finalized part such as nosecone or heatshield, with an extremely long lead time.

Disclosed herein is an improved rapid densification (RD) process to produce C/C structures usable in air and space applications, including hypersonic applications. The process involves modification of the heating method to allow for the uniform heating of preform structures which may be conical or non-axisymmetric components such as heatshields. Special induction heating methods use customized coils to provide desired heating across non-flat components such as cones, non-axisymmetric bodies of revolution, and thick-walled structures. This improvement in induction technology is incorporated to expand the utilization of the RD process for heatshields, thereby reducing the densification time from months to one or two days.

The disclosed technique may be used in the manufacture of components such as nosecone heatshield used for air vehicles engaging in hypersonic flight, including strategic boost glide vehicles, tactical boost glide vehicles, and cruise missiles. It can also be utilized on maneuvering reentry vehicles, as well as man-rated reentry vehicles and interplanetary vehicles.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views.

DETAILED DESCRIPTION

Overview

An objective of the disclosed technique is to reduce the cost and condense the lead time associated with densifying C/C composites and an improved rapid C/C densification process.

The rapid densification (RD) process, also sometimes referred to as film boiling or liquid-vapor phase densification, involves placing a carbon preform in a bath of precursor liquid and heating above the cracking temperature of the precursor (e.g., 900-1300° C.). Densification can be complete in several hours, offering significant cost savings compared to the month(s)-long processing required for chemical vapor infiltration (CVI), hot isostatic pressure impregnation carbonization (HiPIC), and low-pressure pitch impregnation and carbonization (LoPIC). Final parts exhibit uniform through-thickness densities and little to no surface porosity. RD has the capability of accommodating components requiring thick walls and/or complex curvatures.

Embodiments

Figures 1, 2:
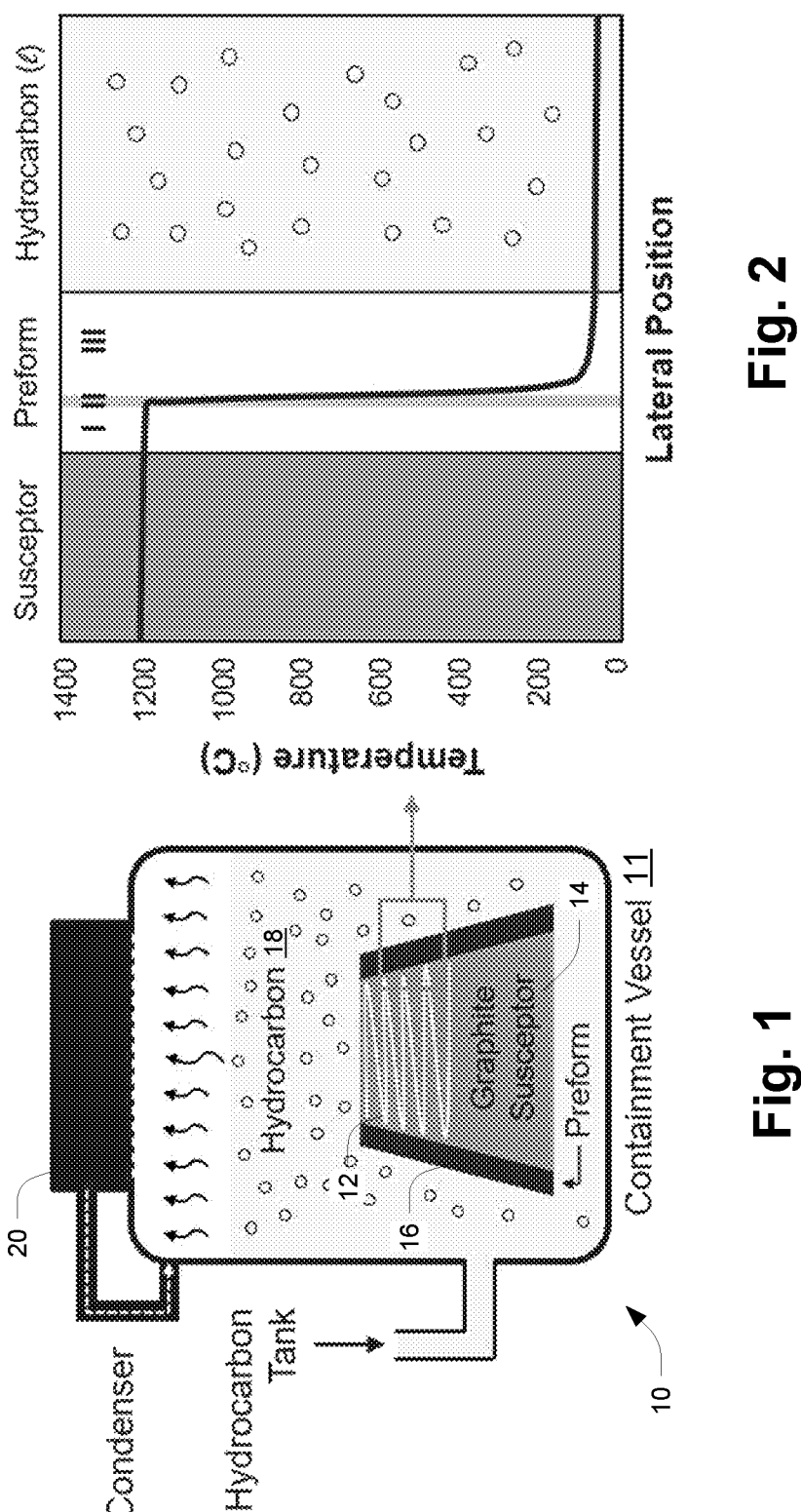
FIG. 1 is a schematic depiction of apparatus for rapid carbon/carbon densification.
FIG. 2 is a plot of a temperature gradient from a susceptor through a preform to a hydrocarbon bath in the densification process.

FIGS. 1 and 2 illustrate a rapid-densification (RD) process and associated apparatus in one embodiment. FIG. 1 shows a simplified schematic of an RD densification system 10 in use. It includes a containment vessel 11, also shown as a "tank", having an interior chamber. In operation, an induction coil 12 heats a graphite susceptor 14 connected to a preform 16 in a hydrocarbon bath 18, resulting in pyrolytic carbon deposition. A condenser 20 (containing water-carrying coils in a nitrogen atmosphere) condenses volatile compounds (mainly hydrogen, methane, and ethylene) that are pumped back into the system. Reactions operate at atmospheric pressure. FIG. 2 illustrates a temperature gradient generated between the susceptor 14 and the hydrocarbon bath 18, across the preform 16, during the densification process. Distinct regions within the preform 16 include (I) densified portion, (II) densification front, and (III) porous portion (not yet densified).

In one embodiment, the carbon preform 16 is submerged in a low-viscosity hydrocarbon liquid 18. The chain length of the hydrocarbon is carefully chosen to balance the melting and boiling points for operation within a prescribed temperature window. Examples include cyclohexane and n-hexane. Induction heating of the susceptor 14, such as a graphite tool, can be used to heat the inner surface(s) of the preform 16 to pyrolyzing temperatures. Acting as a heat sink, the reservoir 18 of liquid hydrocarbon cools the outer surface. This setup generates a steep thermal gradient through the thickness of the densifying part, as shown in FIG. 2.

Vigorous boiling in the surrounding liquid hydrocarbon (at, e.g., 80° C.) generates carbonaceous vapors that diffuse through the porous preform. At elevated temperatures (above the cracking temperature of the hydrocarbon) in the densification front, dissociated gas species deposit preferentially on the heated surface(s) near the susceptor 14. As a result, densification begins at the center of the preform 14 and advances along a densification front radially outward (as opposed to radially inward processes of CVI and HiPIC). Initially, little to no decomposition reactions occur near the outer surface since it is cooled by the liquid hydrocarbon reservoir 18, which eliminates the need for multiple machining steps to infiltrate the preform. The RD process therefore may use only a single infiltration step lasting several hours.

Although the process of FIG. 1 employs a hydrocarbon precursor liquid, in alternative embodiments other organic or even inorganic substances may be used, including for example silane and organosilane. In particular, in another embodiment the precursor liquid may be a preceramic precursor liquid that produces organosilane gases during the RD process.

Figure 3:
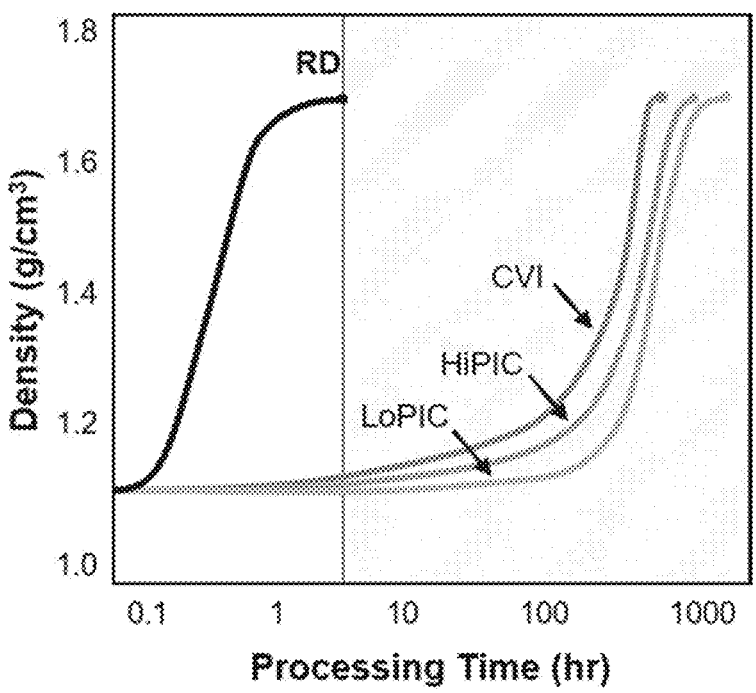
FIG. 3 is a plot of density as a function of processing time for the disclosed rapid densification technique versus known techniques.

FIG. 3 illustrates densification rates for an example RD process (RD) along with the rates for several known C/C densification techniques such as CVI, HiPIC, and LoPIC, with time on a log scale. The rate of densification scales with solid-phase thermal conductivity, operating temperature and frequency, and pressure. Successful infiltration of C/C components can occur at through-thickness rates of ≳1 cm/hr, which is 1-2 orders of magnitude faster than traditional CVI approaches (as shown in FIG. 3). Following a final graphitization step at 2500° C. for 5 hours, final densities of C/C parts made with RD may consistently exceed 90% for a single cycle with average values of 4% porosity readily achievable.

When compared to known approaches to densifying C/C components, the RD process offers a step forward for the C/C industrial base. Radially inward densification processes such as Lo/HiPIC and CVI require multiple time-consuming infiltration cycles and machining steps. LoPIC and HiPIC are both affected by part shrinkage from thermal expansion and are limited by char yield. For CVI, densification rates are limited by a competition between pyrolysis reactions and the inward diffusion of matrix precursor into the preform. Balancing the two competing processes results in extremely long cycle times (e.g., 300-500 hours for a first cycle) and constant machining of the surface to allow for re-infiltration. By contrast, RD allows for the unhindered diffusion of carbonaceous vapors inward, eliminating the need for in-process machining. Using the disclosed RD technique, multiple densification and machining cycles no longer constitute a rate-limiting step to manufacturing C/C components at scale.

Another distinct advantage of the RD process is the ability to use a variety of preform types and structures. Traditional densification approaches are generally limited to phenolic-based prepregs (LoPIC, HiPIC), which may be carbonized and/or graphitized to achieve open porosity and fibrous preforms (CVI). The disclosed RD process may use either of these routes, offering a potential solution to domestic bottle-necks for qualified preform materials.

The thermomechanical performance of a C/C component in a high-temperature, ablative operating environment (e.g., hypersonic flight) is intricately linked with its processing history and resulting structure. For RD, processing parameters such as operating temperature, frequency, and pressure control the graphitic microstructure, defect concentration, porosity, density gradients, and domain size in C/C parts. When compared to traditional approaches such as CVI and HiPIC, RD-densified C/C shows comparable mechanical properties and equivalent interlayer spacing, implying an ordered graphitic structure.

Referring again to FIG. 1, when an induction coil 12 is used, the reactor vessel 11 is preferably made from non-magnetic materials such as quartz, glass, aluminum, austenitic stainless steel, ceramic, polymer matrix composites (PMC) or combinations thereof. In operation, the interior chamber or cavity of the vessel 11 is filled with a precursor liquid ("hydrocarbon bath 18") sufficient to at least cover the preform 16. The precursor liquid is a liquid which will boil and create a vapor containing chemicals that will deposit at a temperature to which the preform can be heated. The precursor liquid is preferably a dielectric having a dielectric constant of at least above 0.5, more preferably above 1, and most preferably above 1.5. To deposit carbon on the preform, a hydrocarbon with appropriate boiling point, such as cyclopentane, cyclohexene, hexene-1, gasoline, toluene, methylcyclohexane, cyclohexane, n-hexane or benzene, or a combination thereof, could be used. The condenser 20 is used to reliquefy vapor and maintain desired operating conditions (thermal equilibrium).

The coil 12 may be is made from copper or other highly conductive material which does not react with the precursor liquid even when heated. Electrical current is provided to the coil in a generally known manner not shown in FIG. 1, e.g., through conductive busses that pass through the reactor walls using respective seals (e.g., silicone rubber). Because of the large amount of current required, the busses must have sufficient cross section to avoid excess heating. The busses may contain water passages to carry cooling water through the busses and the coil 12. The voltage, current, and frequency of operation, as well as the shape of the coil 12, are determined by the shape and geometry of the preform 16 as well as preform properties, and generally known techniques may be used to design induction heating apparatus. In one example, operating voltage is in the range from 5 to 750 V, and operating frequency is in the range of 0.1 kHz to 300 MHz.

Generally, the carbon preform 16 is placed in the cavity in close proximity to the coil 12. The preform 16 may be placed in a support fixture to firmly hold it at a constant position in relation to the vessel 11 and coil 12. The exact shape of the fixture is based on the shape of the preform 12.

Figure 4:
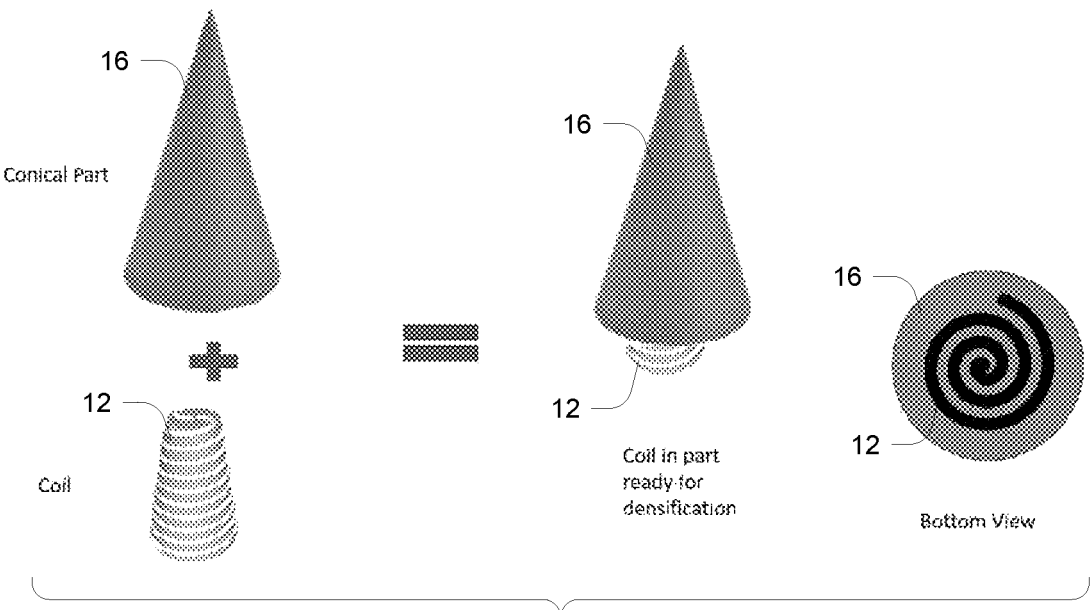
FIG. 4 is a depiction of placement of a preform heater in a preform.

FIG. 4 shows a specific example of coil shape and component positioning in the case of a conical preform 16 such as a heatshield. The preform 16 is placed over the conical-shaped coil 12 and both are located in the vessel (FIG. 1) so as to be covered by the hydrocarbon liquid 18. More generally, for induction heating applications the coil 12 is generally shaped to conform to the shape of the preform 16 being processed. The diameter of the coil might be smaller where the diameter of the preform is smaller. Alternatively, the turn density of the coil can be increased in areas where the object to be heated is further from the coil.

In another embodiment, the apparatus may employ one or more additional coils placed to provide overall conformance to the shape of the preform, and during operation all coils are energized (fed with electrical current) in a manner that provides a desired heating pattern for the rapid densification process.

Figure 5:
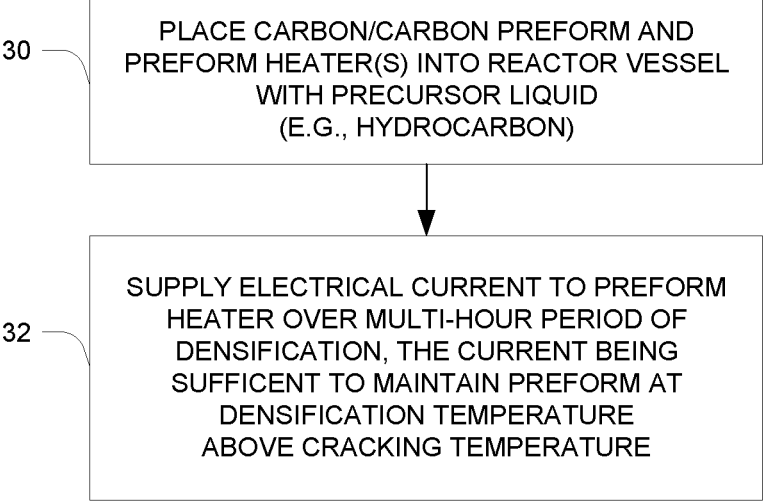
FIG. 5 is a high-level flow diagram of a disclosed rapid densification process.

FIG. 5 is a high-level flow diagram of a method of producing a densified carbon fiber reinforced carbon (carbon/carbon) component (e.g., a nosecone heatshield).

At 30, a carbon/carbon preform and one or more preform heaters are placed into a reactor vessel along with an immersing quantity of a precursor liquid (e.g., hydrocarbon as described above). The reactor vessel preferably includes a condenser for condensing precursor gases (e.g., carbonaceous gases) produced during densification and thereby maintain a thermodynamic equilibrium during the densification process. This may enable the process to be performed at relatively low pressure, e.g., approximately atmospheric pressure, so that the reactor vessel need not be a pressure vessel. In one embodiment, the preform heater is in the form of one or more inductive coils and a susceptor such as described above, but other heater types may be used.

At 32, electrical current is applied to the preform heater over a multi-hour period of densification in which the precursor liquid is continually boiled and the precursor gases continually produced. The electrical current should be sufficient to maintain the preform at a densification temperature above a precursor cracking temperature, thereby causing the precursor gases to be diffused into the preform and dissociated gas species to be deposited. As described above, densification thus begins within the preform and advances outwardly along a densification front until completion. Once densification is complete, the densified component can be machined or processed in other ways as necessary to produce a completely finished component for an intended application. This further processing could include application of a protective surface layer such as an inorganic compound, which can reduce/prevent oxidation and extend operating lifetime such as in a long-glide application.

Although the present disclosure describes an embodiment based on a conical component such as a nosecone heatshield, it will be understood that the disclosed technique can be applied to various alternative thermal protection system components. These include, inter alia, nosetips, as well as acreage, leading edge, or control surfaces for vehicles. Component shapes may of course be other than conical; they could be elliptical (axis-symmetric), or even asymmetric, depending on the vehicle design.

While various embodiments of the invention have been particularly shown and described, it will be understood by those skilled in the art that various changes in form and details may be made therein without departing from the scope of the invention as defined by the appended claims.

What is claimed is:

1. A method of producing a densified carbon fiber reinforced carbon (carbon/carbon) component, comprising:
    placing a carbon/carbon preform and one or more preform heaters into a reactor vessel along with an immersing quantity of precursor liquid, the reactor vessel including a condenser for condensing gases of the precursor produced during densification of the preform and thereby maintaining a thermodynamic equilibrium in the reactor vessel; and
    supplying electrical current to the one or more preform heaters over a multi-hour period of the densification in which the precursor liquid is continually boiled and the precursor gases continually produced, the electrical current being sufficient to maintain the preform at a densification temperature above a cracking temperature of the precursor, thereby causing the precursor gases to be diffused into the preform and dissociated species of the gases to be deposited on the preform, with densification beginning within the preform and advancing outwardly along a densification front until completion,
    wherein the one or more preform heaters includes one or more inductive heating coils disposed in a susceptor, the susceptor being in contact with the surface of the preform, with a temperature gradient generated between the susceptor and the precursor liquid across the preform.

2. The method of claim 1, wherein the preform has a shape forming a hollow, and the one or more preform heaters is shaped and sized to fit within the hollow and is placed in the hollow.

3. The method of claim 2, wherein the preform shape is conical, and the densified carbon/carbon component is a shield for an air vehicle nosecone.

4. The method of claim 1, wherein the susceptor is operative to convert magnetic energy from the one or more heating coils to thermal energy conducted to the preform.

5. The method of claim 1, wherein the preform has a shape forming a hollow, and the one or more heating coils and susceptor are shaped and sized to fit within the hollow with the susceptor in contact with the surface of the preform for conductive heat transfer.

6. The method of claim 1, wherein the densification front is formed and advanced based on a thermal gradient between the surface of the preform in contact with the susceptor and a second surface of the preform in contact with, and cooled by, the precursor liquid.

7. The method of claim 1, wherein the preform is of a phenolic prepreg material and is carbonized and graphitized by the densification.

8. The method of claim 1, wherein the electrical current is supplied at an operating voltage in a range from 5 to 750 volts and an operating frequency in a range of 0.1 kHz to 300 MHz.

9. The method of claim 1, wherein the reactor vessel includes a preform support on which the preform is placed and which holds the preform in constant position relative to the one or more preform heaters.

10. The method of claim 1, wherein the precursor liquid is a liquid hydrocarbon and the precursor gases are carbonaceous gases.

11. The method of claim 10, wherein the liquid hydrocarbon is one of cyclopentane, cyclohexene, hexene-1, gasoline, toluene, methylcyclohexane, cyclohexane, n-hexane, benzene, or a combination thereof.

12. A method of producing a densified carbon fiber reinforced carbon (carbon/carbon) component, comprising:
    placing a carbon/carbon preform and one or more preform heaters into a reactor vessel along with an immersing quantity of preceramic precursor liquid, the reactor vessel including a condenser for condensing organosilane gases produced during densification of the preform and thereby maintaining a thermodynamic equilibrium in the reactor vessel; and
    supplying electrical current to the one or more preform heaters over a multi-hour period of the densification in which the preceramic precursor liquid is continually boiled and the organosilane gases continually produced, the electrical current being sufficient to maintain the preform at a densification temperature above a cracking temperature of the precursor, thereby causing the organosilane gases to be diffused into the preform and dissociated species of the gases to be deposited on the preform, with densification beginning within the preform and advancing outwardly along a densification front until completion,
    wherein the one or more preform heaters includes one or more inductive heating coils disposed in a susceptor, the susceptor being in contact with the surface of the preform, with a temperature gradient generated between the susceptor and the precursor liquid across the preform.

* * * * *